US011762490B1

(12) United States Patent
Kim et al.

(10) Patent No.: US 11,762,490 B1
(45) Date of Patent: Sep. 19, 2023

(54) ELECTRONIC DEVICE DISPLAYS WITH VISIBLY MATCHED BORDERS

(71) Applicant: Apple Inc., Cupertino, CA (US)

(72) Inventors: Kyounghwan Kim, Santa Clara, CA (US); Abbas Jamshidi Roudbari, Saratoga, CA (US); Chia-Hsiang Chen, Hsinchu (TW); Chien-Ya Lee, Taipei (TW); Ching-Sang Chuang, Sunnyvale, CA (US); Jae Won Choi, San Jose, CA (US); Jonathan H. Beck, Redwood City, CA (US); Ming E. Tai, San Jose, CA (US); Warren S. Rieutort-Louis, Cupertino, CA (US); Wen-I Hsieh, Campbell, CA (US); Yuchi Che, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 133 days.

(21) Appl. No.: 17/407,702

(22) Filed: Aug. 20, 2021

Related U.S. Application Data

(60) Provisional application No. 63/076,762, filed on Sep. 10, 2020.

(51) Int. Cl.
| G06F 3/044 | (2006.01) |
| G06F 3/041 | (2006.01) |
| H10K 59/40 | (2023.01) |
| H10K 59/50 | (2023.01) |

(52) U.S. Cl.
CPC ........... *G06F 3/0412* (2013.01); *H10K 59/40* (2023.02); *H10K 59/50* (2023.02); *G06F 3/044* (2013.01)

(58) Field of Classification Search
CPC ....... G06F 3/0412; G06F 3/044; H10K 59/40; H10K 59/50
See application file for complete search history.

(56) References Cited

U.S. PATENT DOCUMENTS

| 7,614,753 | B2 | 11/2009 | Zavarehi et al. |
| 9,398,666 | B2 | 7/2016 | Gandhi et al. |
| 9,622,326 | B1 * | 4/2017 | Devyver ............... G09G 3/3406 |
| 10,031,268 | B2 | 7/2018 | De Jong et al. |
| 10,734,463 | B2 | 8/2020 | Nakajima et al. |

(Continued)

FOREIGN PATENT DOCUMENTS

WO  WO-2019058777 A1 *  3/2019  ........... G06F 3/0412

*Primary Examiner* — Temesghen Ghebretinsae
*Assistant Examiner* — Sosina Abebe
(74) *Attorney, Agent, or Firm* — TREYZ LAW GROUP, P.C.; G. Victor Treyz; Joseph F. Guihan (57) ABSTRACT

An electronic device may have a display with an active area configured to display images and an inactive area that is free of pixels and that does not display images. Touch sensor sense lines may have portions located in the active area and portions located in the inactive area. The active and inactive areas may be characterized by respective reflectivity values. To match the reflectivities of the active and inactive areas and thereby avoid undesired visually distinguishable differences in the appearances of these areas, the touch sensor circuitry in the inactive areas may be configured to match the reflectivity values of the active and inactive areas. Sense line portions in the inactive area may have metal traces of enhanced reflectivity and/or uneven surface topology to enhance ambient light reflections through a circular polarizer that overlaps the active and inactive areas.

20 Claims, 8 Drawing Sheets

(56) References Cited

U.S. PATENT DOCUMENTS

| | | | |
|---|---|---|---|
| 2004/0189196 A1* | 9/2004 | Cok | H10K 50/841 |
| | | | 313/512 |
| 2011/0193872 A1 | 8/2011 | Biernath et al. | |
| 2012/0105774 A1* | 5/2012 | Fletcher | G02B 5/3016 |
| | | | 349/98 |
| 2015/0160767 A1* | 6/2015 | Song | G09G 3/3208 |
| | | | 345/174 |
| 2016/0118448 A1* | 4/2016 | Epstein | H10K 50/865 |
| | | | 257/40 |
| 2016/0379557 A1* | 12/2016 | de Jong | G02B 5/3025 |
| | | | 345/697 |
| 2017/0322357 A1* | 11/2017 | de Jong | G02B 5/223 |
| 2021/0200363 A1* | 7/2021 | Lee | H10K 59/121 |

\* cited by examiner

ELECTRONIC DEVICE DISPLAYS WITH VISIBLY MATCHED BORDERS

This application claims the benefit of U.S. provisional patent application No. 63/076,762, filed Sep. 10, 2020, which is hereby incorporated by reference herein in its entirety.

FIELD

This relates generally to electronic devices, and, more particularly, to electronic devices with displays.

BACKGROUND

Electronic devices often have displays. Touch sensors are sometimes incorporated into displays.

SUMMARY

An electronic device may have a display with an active area configured to display images and an inactive area that is free of pixels and does not display images. The inactive area may run along a border of the active area.

The display may have touch sensor circuitry such as capacitive touch sensor circuitry. The touch sensor circuitry may include drive lines and sense lines. Portions of the sense lines may be located in the active area and portions of the sense lines may be located in the inactive area. For example, sense lines may include metal traces that run along an inactive border area at the peripheral edge of the display.

The active and inactive areas may be characterized by respective reflectivity values. Display structures may be configured to help match the reflectivities of the active and inactive areas and thereby avoid undesired visually distinguishable differences in the appearances of these areas. For example, the metal traces forming the touch sensor sense line portions in the inactive area may be configured to ensure matching of the reflectivity values of the active and inactive areas.

The sense line metal traces in the inactive area may have enhanced reflectivity and/or these traces or dielectric overlapping the traces may be provided with uneven surface topology that enhances ambient light reflections through a circular polarizer that overlaps the active and inactive areas.

DETAILED DESCRIPTION

Electronic devices may be provided with displays. Displays may be used for displaying images for users. Displays may be formed from arrays of light-emitting diode pixels or other pixels. For example, a device may have an organic light-emitting diode display. The electronic devices may have sensors. A two-dimensional capacitive touch sensor may be formed as part of a display. This provides the display with touch screen capabilities.

Figure 1:
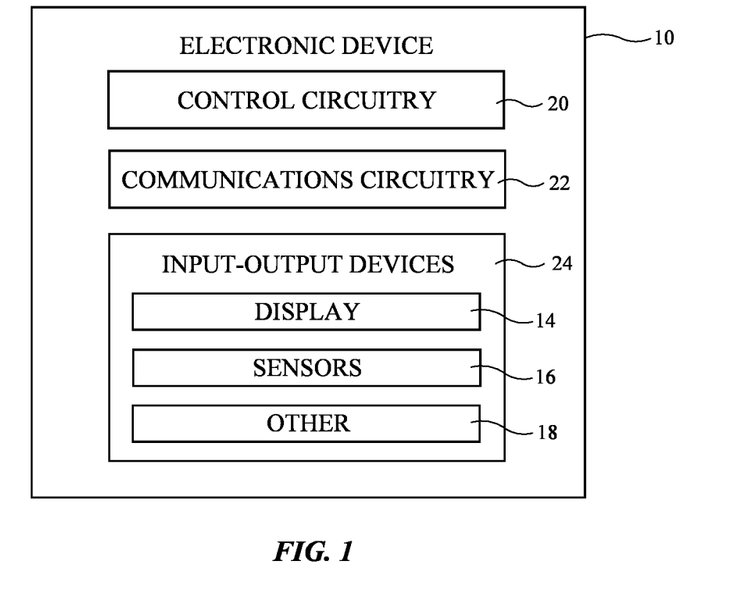
FIG. 1 is a schematic diagram of an illustrative electronic device in accordance with an embodiment.

A schematic diagram of an illustrative electronic device having a display is shown in FIG. 1. Device 10 may be a cellular telephone, tablet computer, laptop computer, wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment. Configurations in which device 10 is a wristwatch, cellular telephone, tablet computer, or other portable electronic device may sometimes be described herein as an example. This is illustrative. Device 10 may, in general, be any suitable electronic device with a display.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 20 may use a display and other output devices in providing a user with visual output and other output.

To support communications between device 10 and external equipment, control circuitry 20 may communicate using communications circuitry 22. Circuitry 22 may include antennas, radio-frequency transceiver circuitry (wireless transceiver circuitry), and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a wireless link operating at a frequency between 6 GHz and 300 GHz, a 60 GHz link, or other millimeter wave link, cellular telephone link, wireless local area network link, personal area network communications link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. Devices 24 may include one or more displays such as display 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Configurations in which display 14 is an organic light-emitting diode display are sometimes described herein as an example.

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices that capture three-dimensional images), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 10 may include additional components (see, e.g., other devices 18 in input-output devices 24). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
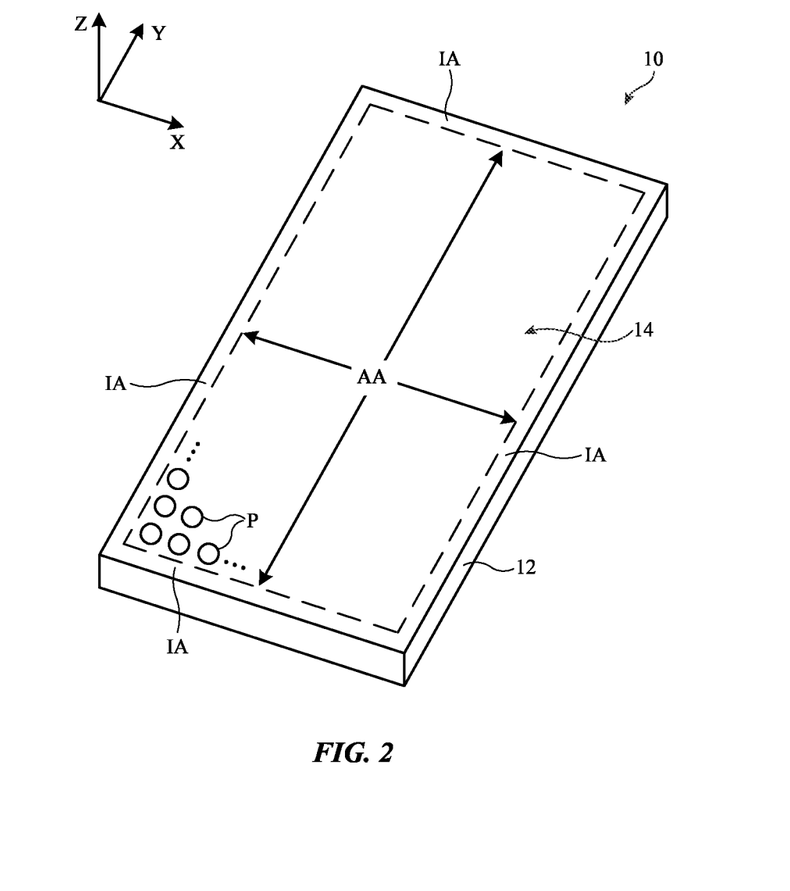
FIG. 2 is a perspective view of an illustrative electronic device in accordance with an embodiment.

FIG. 2 is a perspective view of electronic device 10 in an illustrative configuration in which device 10 is a portable electronic device such as a wristwatch, cellular telephone, or tablet computer. As shown in FIG. 2, device 10 may have a display such as display 14. Display 14 may cover some or all of the front face of device 10. Touch sensor circuitry such as two-dimensional capacitive touch sensor circuitry may be incorporated into display 14. Display 14 may be characterized by an active area such as active area AA and an inactive border region that runs along one or more sides of active area AA (e.g., inactive area IA). Active area AA contains an array of pixels P that are configured to display an image for a user. Inactive area IA is free of pixels and does not display image content. If desired, there may be notch-shaped or island-shaped regions without pixels P in active area AA and these areas may contain inactive display borders (e.g., IA may extend around openings in active area AA and/or other pixel-free regions in display 14). Configurations in which inactive area IA forms a peripheral border for display 14 are sometimes descried herein as an example.

Display 14 may be mounted in housing 12. Housing 12 may form front and rear housing walls, sidewall structures, and/or internal supporting structures (e.g., a frame, midplate member, etc.) for device 10. Glass structures, transparent polymer structures, and/or other transparent structures that cover display 14 and other portions of device 10 may provide structural support for device 10 and may sometimes be referred to as housing structures or display cover layer structures. For example, a transparent housing portion such as a glass or polymer housing structure that covers and protects a pixel array in display 14 may serve as a display cover layer for the pixel array while also serving as a housing wall on the front face of device 10. The portions of housing 12 on the sidewalls and rear wall of device 10 may be formed from transparent structures and/or opaque structures.

Device 10 of FIG. 2 has a rectangular outline (rectangular periphery) with four corners. Device 10 may have other shapes, if desired (e.g., circular shapes, other shapes with curved and/or straight edges, etc.).

Figure 3:
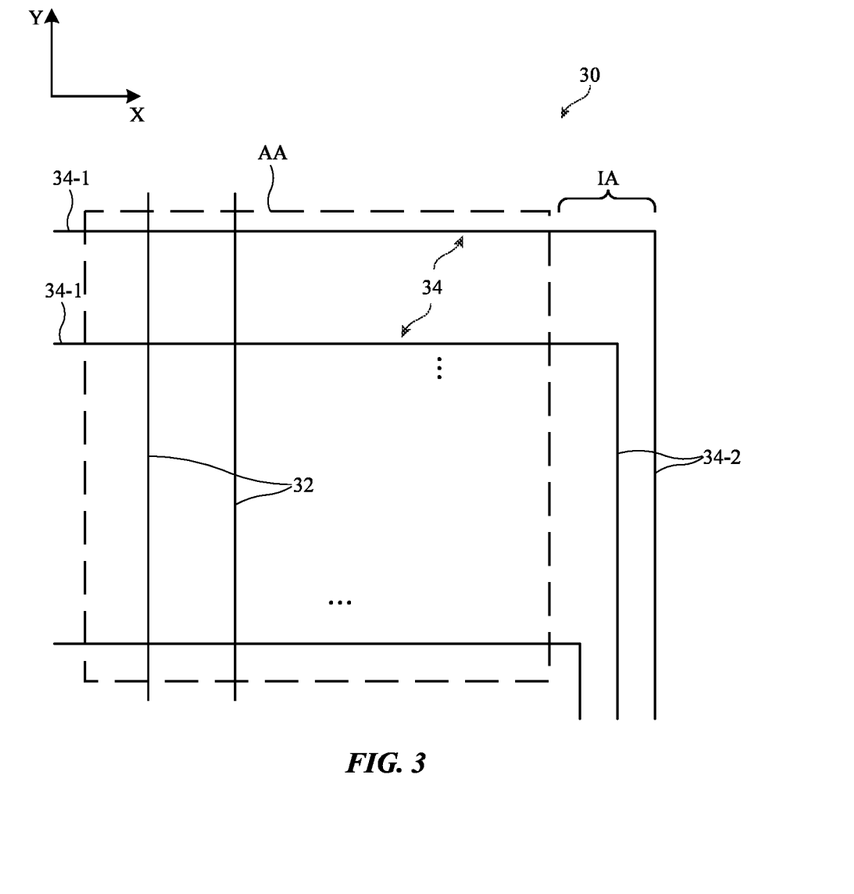
FIG. 3 is a circuit diagram of illustrative touch sensor circuitry in accordance with an embodiment.

Display 14 may include a two-dimensional capacitive touch sensor. Illustrative touch sensor circuitry for display 14 is shown in FIG. 3. As shown in FIG. 3, touch sensor 30 may include touch sensor signal lines such as drive lines 32 and sense lines 34. Any suitable number of drive and sense lines may be present in display 14. As an example, there may be at least 10, at least 20, at least 50, fewer than 75, fewer than 30, 10-30, 5-40, or other suitable number of drive lines and there may be at least 10, at least 20, at least 50, fewer than 75, fewer than 30, 10-30, 5-40, or other suitable number of sense lines in display 14.

Drive lines 32 may, as an example, extend parallel to the Y axis of FIG. 3. Sense lines 34 may have sense line portions 34-1 that extend along the X axis (e.g., perpendicular to drive lines 32) in active area AA. Each of the sense line portions 34-1 in active area AA of display 14 may be coupled to a corresponding sense line portion 34-2. Portions 34-2 may be formed from sense line metal traces that extend parallel to the Y axis along the peripheral edge of display in inactive area IA. The metal traces that form sense line portions 34-2 for circuitry 30 may be formed in the inactive areas IA on multiple edges of device 10 (e.g., left and right edges and/or upper and/or lower edges). Sense line circuitry and/or other circuitry in inactive area IA may sometimes be referred to as inactive area circuitry, inactive area signal lines, inactive area metal traces, inactive border region metal traces, etc.

Different types of circuitry are present in areas AA and IA. For example, pixels P of active area AA may contain anodes in organic-light-emitting diodes, whereas the circuitry of inactive area IA may contain no anodes but may contain potentially wide metal traces associated with portions 34-2 of sense lines 34 (as an example). The differences in the sizes of metal traces, the presence or absence of particular types of structures (e.g., the presence of pixel anodes in active area AA and the absence of these structures in inactive area IA), differences in the surface topography of the thin-film structures in areas AA and IA, and/or other differences in the attributes of the circuitry in areas AA and IA can lead to undesirable reflectivity differences between areas AA and IA. For example, if care is not taken, inactive area IA may appear noticeably darker (or lighter) than active area AA. These undesirable visual artifacts may be minimized by configuring the structures of inactive area IA (and, if desired, the structures of active area AA) so that the reflectivities of these areas match under at least some ambient lighting conditions.

Figure 4:
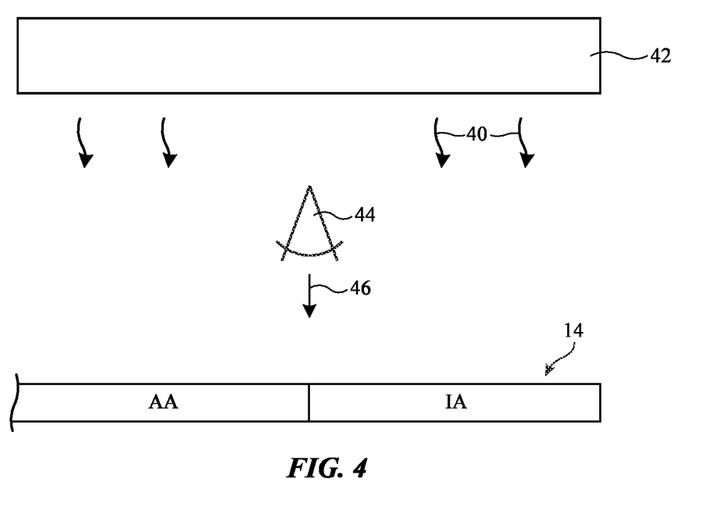
FIG. 4 is a side view of an illustrative display with active and inactive areas in accordance with an embodiment.

Consider, as an example, the scenario shown in FIG. 4. As shown in FIG. 4, display 14 of device 10 may often be illuminated by diffuse light 40 produced by a diffuse lighting source 42. When the user is outdoors, light source 42 may be light from the outdoors environment surrounding device 10, when the user is indoors, light source 42 may include household lighting (as an example). In a test environment, a diffuse light source such as light source 40 may be implemented using a light-emitting diode light box or other uniform light source (e.g., a light source with at least 90% uniformity or other suitable uniformity).

A viewer such as viewer 44 may view the surface of display 14 in direction 46 (e.g., a direction oriented perpendicular to the surface of display 14). In this type of on-axis diffuse illumination viewing environment, the user preferably will not discern a noticeable difference in reflected light from active area AA and inactive area IA. As an example, the difference between intensity of light reflected from area AA and the intensity of light reflected from area IA for the FIG. 4 configuration may be less than 10%, less than 8%, less than 7%, less than 6%, less than 5%, less than 4%, less than 3%, less than 2%, or less than 1% (as examples). By configuring display 14 so that the reflectivity of the inactive and active areas is similar in this way, potentially unsightly dark border effects (or light border effects) can be avoided.

Figure 5:
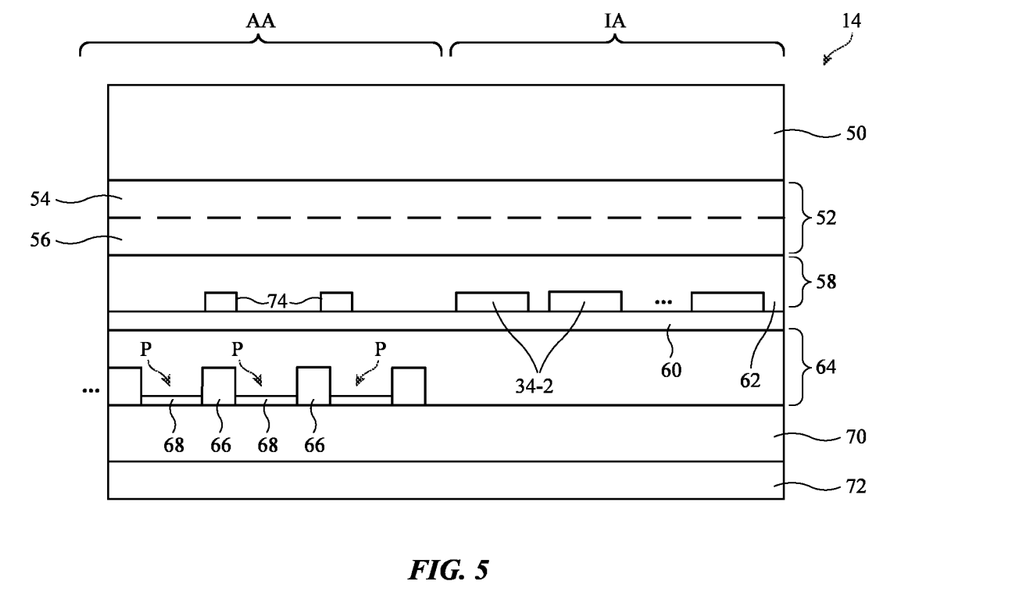
FIG. 5 is a cross-sectional side view of an illustrative display in accordance with an embodiment.

Active and inactive area reflectance matching for display 14 may be achieved by selecting appropriate configurations for the composition and layout of the metal traces and other thin-film structures used in forming the circuitry in active area AA and inactive area IA. FIG. 5 is a cross-sectional side view of an illustrative portion of display 14 including part of active area AA and inactive area IA. As shown in FIG. 5, display 14 may include an array of pixels P that are configured to produce an image in active area AA. Inactive area IA is free of pixels.

Pixels P may be formed using thin-film transistor circuitry 70 (e.g., light-emitting diodes and light-emitting diode control circuits formed from thin-film transistors, capacitors, and/or other thin-film circuitry). The circuitry may be formed on substrate 72 (e.g., a layer of polyimide). Thin-film transistor circuitry may include thin-film metal layers and dielectric layers. Each pixel P may have a light-emitting diode with a respective anode 68. The light-emitting diodes of pixels P also have organic emissive material, cathodes, etc. Anodes 68 may have any suitable shape (e.g., rectangular shapes, etc.). Anodes 68 may be formed from metal, conductive semiconductor material such as indium tin oxide, and/or other conductive material. In an illustrative configuration, each anode 68 may have a layer of silver sandwiched between a pair of indium tin oxide layers.

Opaque organic material (e.g., black polymer) may be used in forming pixel definition layer 66. Layer 66 may be patterned to form openings for pixels P (e.g., openings that receive respective anodes 68). Pixels P may have any suitable size. For example, pixels P may have lateral dimensions of 20-60 microns, at least 40 microns, less than 40 microns, or other suitable size. The pixel pitch (center-to-center spacing) of pixels P may be 20-60 microns, 30-55 microns, at least 25 microns, less than 55 microns, or other suitable pitch. The lateral size of the pixel definition layer structures between adjacent pixels may be at least 5 microns, at least 15 microns, less than 25 microns, or other suitable width. Pixels P and the other thin-film circuitry of display 14 (e.g., thin-film circuitry 70) may be covered with polymer layer 64 (e.g., an encapsulation layer). Further encapsulation and signal traces may be provided by thin-film layers 58 on layer 64. Thin-film layers 58 may include conductive signal paths forming sense and drive lines, buffer layers, encapsulation layers, interlayer dielectric layers, etc. Conductive signal paths may be formed from patterned metal traces. Dielectric layers in layers 58 may be formed from inorganic dielectric material such as silicon nitride, silicon oxide, etc.

As shown in FIG. 5, one or more dielectric layers such as layer 60 may be formed on the upper surface of layer 64. Metal traces may be formed on and/or embedded within layers such as layer 60. For example, active area AA may contain metal traces 74 that are formed on and/or are embedded within dielectric thin-film layers such as layer 60. Metal traces 74 may be aligned with pixel definition layer 66 in active area AA so as to not obstruct light that is emitted from pixels P. Traces 74 may, for example, include drive lines 32 and sense line portions 34-1. Traces 74 may have widths of at least 2 microns, 3 microns, 2-5 microns, less than 10 microns, or other suitable width. A dielectric thin-film layer (e.g., one of layer(s) 60) may be interposed between lines 32 and portions 34-1 (e.g., dielectric isolation may be used to allow sense and drive lines to bridge over each other without being shorted to each other in active area AA).

Inactive area IA may contain metal traces such as sense line portions 34-2. Portions 34-2 may run along the peripheral edge of display 14. The total width of all of the sense lines formed from portions 34-2 in inactive area IA may be 200-300 microns, at least 50 microns, at least 100 microns, 150-200 microns, less than 450 microns, less than 300 micron, less than 220 microns, or other suitable width.

Organic planarization layer 58 (e.g., an acrylic-based polymer) may cover the dielectric and metal layers on layer 64. These dielectric and metal layers include touch sensor lines formed by traces 74 in active area AA and touch sensor lines such as sense line portions 34-2 in inactive area IA.

Display 14 may have a protective cover layer such as display cover layer 50. Display cover layer 50 may be formed from a transparent material such as glass, polymer, sapphire or other crystalline material, ceramic, and/or other clear materials. Circular polarizer 52 may be interposed between display cover layer 50 and layer 58. Adhesive may be used in attaching the structures of display 14 together. For example, adhesive may be used to attach polarizer 52 to underlying layers and may be used to attach cover layer 50 to polarizer 52.

Polarizer 52 may include linear polarizer 54 and quarter wave plate 56. The presence of circular polarizer 52 helps to suppress ambient light reflections (e.g., polarizer 52 absorbs ambient light that has traveled inwards through cover layer 50 to the underlying structures of display 14 and that has reflected outwardly from these structures). Circular polarizer 52 may, for example, suppress ambient light reflections from metal traces 74, sense line portions 34-2, anodes 68, and/or other structures in display 14.

As described in connection with FIG. 4, the different structures in active area AA and inactive area IA give rise to a risk that the reflectivities of these two areas will differ. One of the factors that affects the overall reflectivity of area AA and the overall reflectivity of area IA relates to the reflectivity of the conductive signal traces in these structures. Signal trace reflectivity can be influenced by the bulk reflectivity of the metals or other conductive materials used in forming the traces. For example, titanium (which has a bulk reflectivity of about 50-55%) tends to be less reflective than aluminum (which has a bulk reflectivity of about 90%). Another factor that affects reflectivity relates to thin-film interference effects associated with stacked thin-film layers. For example, dielectric layers, signal traces that are formed from multiple thin-layers of metal, and/or other thin-film structures may experience constructive and destructive interference at various different wavelengths of light, angles of incidence, polarization, etc. Thin-film interference effects can therefore cause light reflection to locally increase and/or decrease as a function of these factors. Yet another factor influencing ambient light reflection from areas AA and IA relates to surface topography. In theory, circularly polarizer 52 can be used to suppress 100% of all reflected ambient light. In practice, surface roughness introduces phase shifts and/or polarization changes to the reflected light that cause circular polarizer 52 to extinguish less than 100% of reflected light. In general, light reflected from a uniformly smooth surface will tend to be absorbed more completely than light reflected from a surface with variations in topography (e.g., rough surfaces, structures with lateral variations in refractive index, etc.).

Display 14 preferably uses one or more of these reflectance adjustment techniques to ensure that the reflectivity of active area AA and the reflectivity of inactive area IA are matched (plus or minus) within 10%, within 8%, within 7%, within 6%, within 5%, within 4%, within 3%, within 2%, or within 1% (as examples). The reflectivity of area AA (and therefore area IA) may be 40%, 50%, 60%, at least 35%, at least 45%, 30-65%, less than 70%, 40-60%, less than 50%, or other suitable value (e.g., for on-axis viewing with diffuse lighting, averaged across all visible light wavelengths from 380 to 740 nm).

Figure 6:
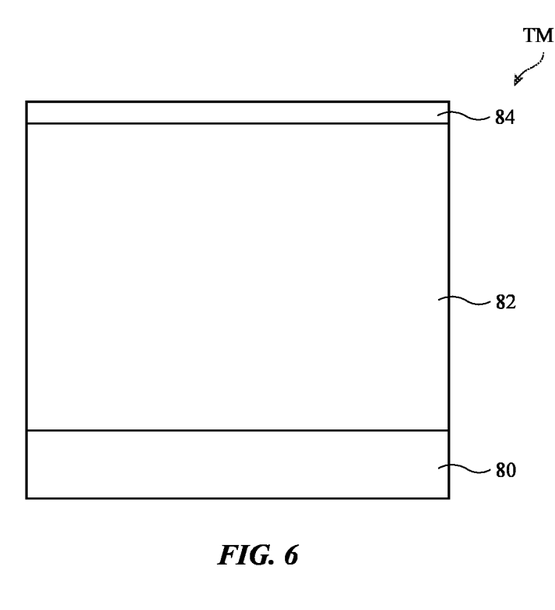
FIG. 6 is a cross-sectional side view of an illustrative touch sensor metal trace in accordance with an embodiment.

FIG. 6 is a cross-sectional side view of an illustrative layer of metal (touch sensor metal layer TM, sometimes referred to as touch metal) that may be used in forming touch sensor signal lines such as sense lines and/or drive lines. As shown in FIG. 6, touch metal layer TM may include first layer 80 (e.g., a layer of titanium), second layer 82 (e.g., a layer of aluminum), and third layer 84 (e.g., a layer of titanium). In an illustrative configuration, the thickness of the first layer is 30 nm, 10-50 nm, or other suitable thickness, the thickness of the second layer is 300 nm, 150-600 nm, or other suitable thickness, and the thickness of the third layer is relatively small compared to the other layers (e.g., the third layer has a thickness of 10 nm, 5-20 nm, less than 25 nm, less than 40 nm, or other suitable relatively small value). The use of a thin layer of titanium in forming layer TM may help increase the reflectivity of metal layer TM (e.g., by allowing more incident light to penetrate to the higher-reflectivity aluminum of layer 82 and/or due to thin-film interference effects in layer TM). By using this type of metal trace to form sense line portions 34-3, the reflectivity of the metal traces in inactive area IA can be enhanced, thereby helping to match the reflectivity of inactive area IA to that of active area AA (which may tend to be relatively large due to the presence of reflective structures such as anodes 68 and the relatively rough surfaces of the thin-film structures in active area AA, which tend to reduce the ability of circular polarizer 50 to completely absorb reflected ambient light in active area AA).

Figure 7:
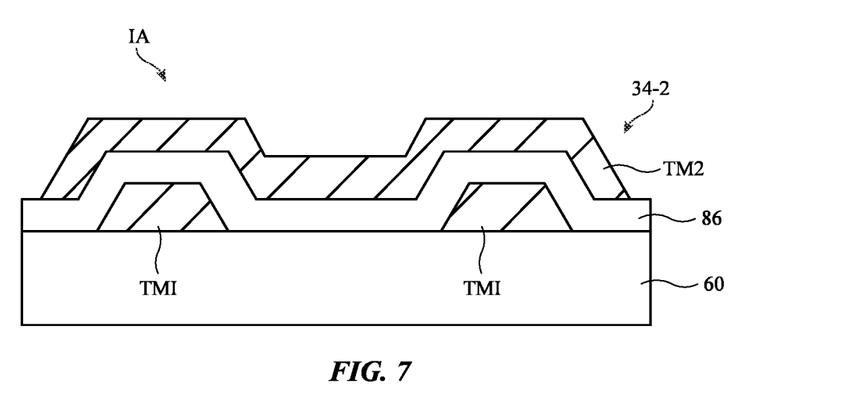
FIGS. 7 and 8 are cross-sectional side views of illustrative touch sensor metal traces with surface texture in accordance with embodiments.
Figure 8:
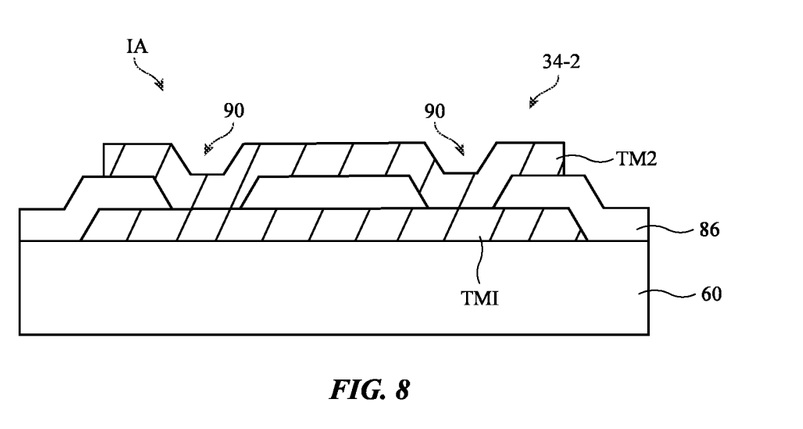

If desired, the reflectivity of active area AA and IA may be matched, at least partly, by enhancing surface roughness of the reflective structures in active area IA. Consider, as an example, the cross-sectional side views of sense line portions 34-2 that are shown in FIGS. 7 and 8. In these illustrative configurations, two layers of touch sensor metal traces (touch metal TM1 and touch metal TM2) are being used to form some or all of sense line portions 34-2. Surface roughness features (e.g., height variations on the order of the thickness of touch metal TM1 and/or the thickness of an interposed dielectric layer such as layer 86 which may be, as an example, 0.1-0.9 microns) have been incorporated into these traces to help enhance phase shifts and/or variations in reflective light polarization that can help reduce the amount of reflected ambient light in inactive area IA that is blocked by circular polarizer 50.

Touch metals TM1 and TM2 may be formed on layer(s) 60 (e.g., a buffer layer or other inorganic layer on layer 64). In active area AA, dielectric layer 86 (e.g., an inorganic thin-film layer that serves as an interlayer dielectric layer) may be used to allow touch metal TM 2 to bridge over touch metal TM1. This allows the sense and drive lines in active area AA to pass over each other without being electrically shorted to each other. Dielectric layer 86 may also be present in inactive area IA.

In the illustrative arrangement of FIG. 7, touch metals TM1 and TM2 are separated from each other by dielectric layer 86 along some or all of the length of sense line portions 34-2. To create surface roughness features to help enhance ambient light reflectivity, touch metal TM1 has been photolithographically patterned before depositing dielectric layer 86 and touch metal TM2. As shown in FIG. 7, the patterning of touch metal TM1 creates height variations in the exposed surface of touch metal TM2. As a result, sense line portions 34-2 will have different heights at different locations and these surface roughness structures in sense line portions 34-2 will help allow reflected ambient light to pass through circular polarizer 50.

Another illustrative arrangement for creating uneven topography for sense line portions 34-2 is shown in FIG. 8. In this configuration, vias 90 (openings through dielectric layer 86 that are filled with portions of touch metal TM2) are formed at various locations along the length of sense line portion 34-2. Vias 90 may, as an example, have randomly distributed locations within sense line portion 34-2 to help avoid creating visible artifacts due to the use of regularly positioned vias. The total fractional area occupied by vias 90 in sense line portions 34-2 may be 2-30%, 5-20%, at least 2%, at least 3%, at least 5%, at least 8%, at least 10%, less than 30%, less than 25%, less than 15%, or other suitable amount. The use of vias 90 periodically shorts touch metal TM2 to touch metal TM1 and may thereby help reduce the resistance of sense line portions 34-2 in inactive area IA. Vias 90 may have circular footprints (outlines when viewed from above in a direction perpendicular to the surface of display 14) or may have other suitable shapes (e.g., rectangular outlines, etc.).

If desired, dielectric layers in active area AA and/or inactive area IA may be provided with rough surfaces. Consider, for example, the illustrative arrangement of sensor line portion 34-2 of FIG. 9. In this illustrative arrangement, sense line portion 34-2 may or may not be provided with uneven topography using arrangement of the types shown in FIGS. 7 and 8. Sense line portion 34-2 may be formed from one or more layers of touch metal such as touch metal TM1 and TM2 on layer 92 (e.g., one or more dielectric layers such as layer 64, layer(s) 60, etc. of FIG. 5). To create optical phase shifts and/or polarization variations that can reduce the amount by which ambient light reflected from portion 34-2 is absorbed by circular polarizer 50, one or more overlapping dielectric layers on portion 34-2 may be provided with uneven surface heights (e.g., one or more overlapping dielectric layers may be provided with texture such as corrugations).

Figure 9:
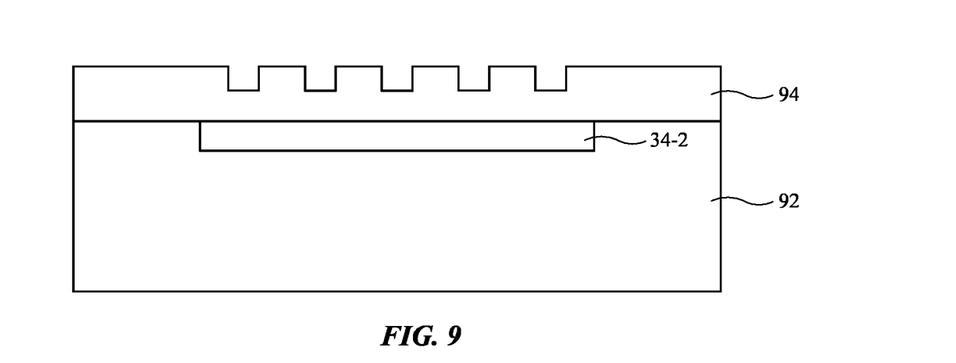
FIG. 9 is a cross-sectional side view of an illustrative touch sensor metal trace covered with a patterned dielectric layer that creates phase shifts in light illuminating the touch sensor metal trace in accordance with an embodiment.

In the example of FIG. 9, polymer layer 94 overlaps portion 34-2. Layer 94 may be, for example, a photoimageable polymer layer such as an acrylic-based polymer that forms some or all of layer 58 of FIG. 5. By patterning layer 94 with photolithography, layer 94 may be provided with corrugations or other texture exhibiting variations in height (thickness). Some photosensitive polymers exhibit changes in refractive index with light exposure. If desired, such photo-induced refractive index changes may be used in addition to or instead of creating thickness variations in layer 94. Due to the optical roughness of layer 94 (e.g., uneven surface topography and/or refractive index variations in layer 94), phase shifts and polarization variations are induced in ambient light that is being reflected from portion 34-2. This helps increase the magnitude of the reflected ambient light from portions 34-2 relative to the magnitude of the reflected ambient light from active area AA.

In general, one or more of the arrangements descried in connection with FIGS. 6, 7, 8, and/or 9 may be used in configuring the structures of active area AA and IA to have matched ambient light reflection characteristics. These arrangements may include arrangements in which the touch sensor traces or other metal traces have enhanced reflectivities (e.g., by providing a sufficiently thin size to the upper titanium layer in a Ti/Al/Ti metal trace such as a touch sensor sense line), arrangements in which an uneven metal trace surface topography is created (e.g., by patterning touch metal TM1, by patterning dielectric layer 86 to create vias, etc.), by creating a height variation, refractive index pattern, or other optically uneven pattern in a dielectric layer overlapping a reflective metal trace such as sense line traces in portions 34-2, by using other arrangements, and/or by using combinations of two or more, three or more or four or more of these arrangements.

The foregoing is merely illustrative and various modifications can be made to the described embodiments. The foregoing embodiments may be implemented individually or in any combination.

What is claimed is:

1. An electronic device, comprising:
a housing;
a display cover layer mounted in the housing;
a light-emitting diode display having an active area with pixels configured to display an image and having a pixel-free inactive area with touch sensor metal traces; and
a circular polarizer between the light-emitting diode display and the display cover layer, wherein the active area has a first ambient light reflectivity value associated with on-axis ambient light reflections under diffuse lighting, wherein the inactive area has a second ambient light reflectivity value associated with on-axis ambient light reflections under diffuse lighting, and wherein the inactive area comprises touch sensor circuitry configured to match the first ambient light reflectivity value to the second ambient light reflectivity value within 10%.

2. The electronic device defined in claim 1 wherein the touch sensor circuitry comprises portions of touch sensor sense lines.

3. The electronic device defined in claim 1 wherein the touch sensor circuitry comprises metal traces forming portions of touch sensor lines and comprises photoimageable polymer overlapping the touch sensor lines and wherein the photoimageable polymer has an uneven surface topology that enhances the second ambient light reflectivity value.

4. The electronic device defined in claim 1 wherein the touch sensor circuitry comprises first and second metal layers, wherein the first metal layer is patterned to form lateral gaps between portions of the first metal layer and wherein the second metal layer overlaps the first metal layer and has an uneven surface topology due to the openings.

5. The electronic device defined in claim 1 wherein the touch sensor circuitry comprises first and second metal layers separated by a dielectric layer, wherein vias are formed in the dielectric layer, wherein portions of the second metal contact the first metal layer through the vias, and wherein the vias create an uneven surface topology that enhances the second ambient light reflectivity value.

6. The electronic device defined in claim 1 wherein the touch sensor circuitry comprises touch sensor metal traces, wherein each touch sensor metal trace is formed from a layer of a first metal sandwiched between upper and lower layers of a second metal that is different than the first metal and wherein the upper layer of the second metal has a thickness of less than 40 nm.

7. The electronic device defined in claim 6 wherein the upper layer of the second metal has a thickness of less than 20 nm.

8. The electronic device defined in claim 7 wherein the second metal comprises titanium and wherein the first metal comprises aluminum.

9. The electronic device defined in claim 1 wherein the touch sensor circuitry comprises sense line metal traces.

10. The electronic device defined in claim 9 wherein the sense line metal traces have uneven surface topography that is configured to enhance the second ambient light reflectivity level by enhancing reflected ambient light transmission through the circular polarizer.

11. The electronic device defined in claim 10 wherein the sense line metal traces comprise a first layer of touch metal, a dielectric layer on the first layer of touch metal, and a second layer of touch metal on the first layer of touch metal.

12. The electronic device defined in claim 11 wherein the uneven surface topography is produced by vias in the sense line metal traces.

13. The electronic device defined in claim 12 wherein each via is formed from an opening in the dielectric layer through which a portion of the second layer of touch metal contacts the first layer of touch metal.

14. The electronic device defined in claim 13 wherein the sense line metal traces have a total area in the inactive area and wherein the vias consume 5-15% of the total area.

15. The electronic device defined in claim 14 wherein the vias have circular shapes and wherein the vias are positioned at random locations along the sense line metal traces.

16. The electronic device defined in claim 1 wherein the touch sensor circuitry is configured to match the first ambient light reflectivity value to the second ambient light reflectivity value within 5%.

17. A display, comprising:
   a substrate;
   a circular polarizer;
   organic light-emitting diode pixels on a first area of the substrate under the circular polarizer that are configured to produce an image; and
   touch sensor metal traces having first portions that extend through the first area and having second portions in a second area of the substrate under the circular polarizer that is free of pixels and does not produce any images, wherein the second portions have vias that occupy 2-30% of the second portions.

18. The display defined in claim 17 wherein the first area is characterized by a first ambient light reflectivity value associated with on-axis ambient light reflections under diffuse lighting, wherein the second area is characterized by a second ambient light reflectivity value associated with on-axis ambient light reflections under diffuse lighting, and wherein the vias are configured to match the first ambient light reflectivity value to the second ambient light reflectivity value within 10%.

19. The display defined in claim 17 wherein the vias are positioned at random locations along the second portions of the touch sensor metal traces.

20. An organic light-emitting diode display having first and second areas, wherein the first area is characterized by a first ambient light reflectivity value associated with on-axis ambient light reflections under diffuse lighting and wherein the second area is characterized by a second ambient light reflectivity value associated with on-axis ambient light reflections under diffuse lighting, the organic light-emitting diode display comprising:
   a circular polarizer;
   organic light-emitting diode pixels under the circular polarizer in the first area that are configured to produce an image; and
   touch sensor metal traces under the circular polarizer, wherein the touch sensor metal traces have first portions that extend through the first area and have second portions in the second area, wherein the second area is free of pixels and does not produce any images, and wherein the second portions have an uneven surface topology configured to match the second ambient light reflectivity value to the first ambient light reflectivity value within 6%.

* * * * *